United States Patent

[11] 3,590,281

[72] Inventor William G. Russell
Kitchener, Ontario, Canada
[21] Appl. No. 841,196
[22] Filed July 14, 1969
[45] Patented June 29, 1971
[73] Assignee Electrohome Limited
Kitchener, Ontario, Canada

[54] ELECTRONIC LATCHING NETWORKS EMPLOYING ELEMENTS HAVING POSITIVE TEMPERATURE COEFFICIENTS OF RESISTANCE
5 Claims, 1 Drawing Fig.

[52] U.S. Cl. .......... 307/272, 307/278, 307/288, 307/311, 315/131, 315/200, 340/175, 340/415
[51] Int. Cl. .......... H03k 3/286
[50] Field of Search .......... 307/272, 278, 288, 311; 315/129, 131, 200 A, 201, 205, 208; 330/30 D, 69; 340/175, 332, 415

[56] References Cited

UNITED STATES PATENTS 3,191,073 6/1965 Mooney .......... 307/290
3,373,315 3/1968 Colman .......... 307/288 X

*Primary Examiner*—John S. Heyman
*Assistant Examiner*—R. C Woodbridge
*Attorney*—Peter W. McBurney

ABSTRACT: An electronic latching network has two or more groups of transistors. In each group there is an element, such as an incandescent lamp, having a positive temperature coefficient of resistance, and this characteristic is used to ensure that when one group of transistors is turned on, the transistors of all other groups are turned off.

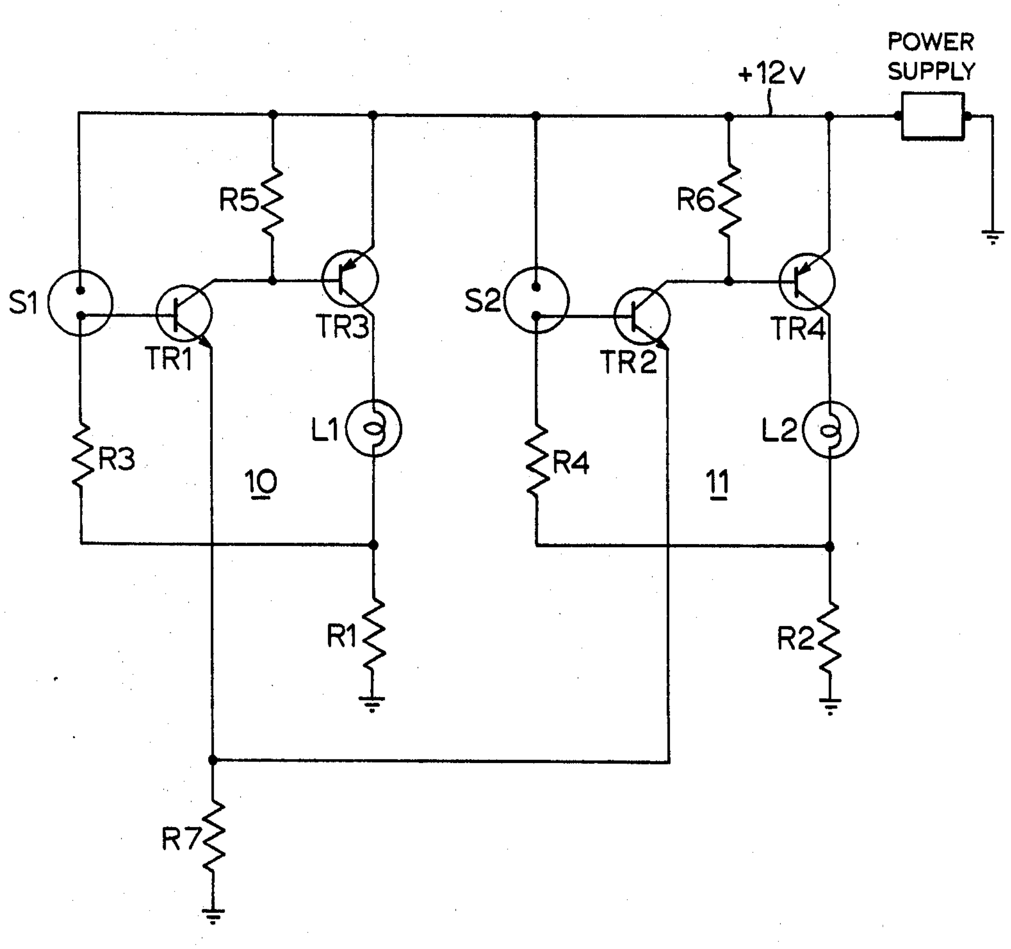
INVENTOR.
WILLIAM G. RUSSELL
BY

ELECTRONIC LATCHING NETWORKS EMPLOYING ELEMENTS HAVING POSITIVE TEMPERATURE COEFFICIENTS OF RESISTANCE

This invention relates to electronic latching networks. More particularly, this invention relates to electronic latching networks having novel cancelling arrangements.

Electronic latching networks are composed of at least two stages and are designed with cancelling circuits so that the "on" stage will be turned off when any other stage is triggered or turned on. The turning off of the "on" stage may be accomplished in a number of ways, a common way being the provision of a turnoff pulse that is higher than the holding voltage of the "on" stage and the application of this pulse to the "on" stage. However, with a latching network that employs a single supply voltage, it is difficult to provide such a turnoff pulse using simple circuitry.

In accordance with this invention, an electronic latching network is provided with a simple and inexpensive cancelling circuit that can be used even when a single supply voltage is used for the latching network. The cancelling circuit employs in each stage of the network an element having a positive temperature coefficient of resistance.

This invention will become more apparent from the following detailed description, taken in conjunction with the appended FIGURE, which is a circuit diagram of a two stage latching network embodying this invention.

Referring to the FIGURE, the latching network is shown as having two stages 10 and 11, or two groups of transistors but as many stages or groups of transistors as desired can be employed.

Stages 10 and 11 are identical, so a description of only one stage will be sufficient. Stage 10 now will be described with the components of stage 11 being designated by numerals one greater than the corresponding components of stage 10. Stage 10 includes two transistor TR1 and TR3 each having input, output and common electrodes. The input electrodes are the base electrodes of transistors TR1 and TR3. The common electrodes are the emitter electrodes of transistors TR1 and TR3 while the output electrodes are the collector electrodes of transistors TR1 and TR3.

Connected in the output circuit of transistor TR3, i.e., in series with the output and common electrodes of transistor TR3, is an element L1 having a positive temperature coefficient of resistance and a resistor R1. Element L1 preferably is an incandescent lamp, since such an element will provide a visual indication of when stage 10 is turned on, but element L1 may be any other device having a positive temperature coefficient of resistance, e.g., a wire wound resistor. Lamp L1 has one of its terminals connected to the collector electrode of transistor TR3 and the other to one terminal of resistor R1. The other terminal of resistor R1 is connected to ground, i.e., to the negative terminal of a power supply P.S. having a positive terminal 12 at a positive DC potential of, say, +12 volts. Thus lamp L1 and resistor R1 are connected in series circuit with each other between the collector electrode of transistor TR3 and ground.

The emitter of transistor TR3 is connected to terminal 12.

A resistor R3 is connected between the base electrode of transistor TR1 and the ungrounded terminal of resistor R1, this connection providing a path to hold transistor TR1 on when transistor TR3 is on, as will be explained in greater detail hereafter.

A switch S1, which may be of the touch type, for example, has one of its contacts connected to the base electrode of transistor TR1 and the other of its contacts connected to terminal 12.

A resistor R5 is connected between terminal 12 and the collector electrode of transistor TR1, the latter being connected to the base electrode of transistor TR3.

Transistors TR1 and TR3 are so interconnected that when transistor TR1 is turned on or off, it turns transistor TR3 on and off respectively.

Common to all groups or stages is a resistor R7 that is connected in circuit with the output and common electrodes of transistors TR1, TR2, etc., being connected between ground and the emitter electrodes of these transistors.

The operation of the latching network now will be described. Assume that transistors TR2 and TR4 are turned on, so that stage 11 is on and stage 10 is off. Further assume that the resistance of lamp L2 has reached its hot value, which is greater than its cold value. Under these circumstances, with a 12 volt power supply and appropriate components, there will be about a ½-volt drop between the emitter and collector electrodes of transistor TR4, about a 5 1/5-volt drop across lamp L2 and about a 6-volt drop across resistor R2. The voltage across resistor R2 forward biases the base-emitter junction of transistor TR2 and holds this transistor on. The base-emitter voltage drop of transistor TR2 is about one-half volt, so the voltage at the emitter of transistor TR2 and across resistor R7 will be about 5½ volts less the drop across resistor R4, which may be about 1 volt. The base-emitter junction of transistor TR1 thus will be reverse biased, so transistor TR1 will be turned off, and transistor TR1 being off in conjunction with the base and emitter of transistor TR3 both being connected to terminal 12 results in transistor TR3 being turned off as well.

In order to turn on stage 10 and turn off stage 11, switch S1 may be closed momentarily. This will forward bias the base-emitter junction of transistor TR1 and turn this transistor on. The turning on of transistor TR1 results in the turning on of transistor TR2, but since lamp L1 is cold and has a lower cold than hot resistance, the voltage drop across lamp L1 will be about 4 volts, the voltage drop across resistor R1 will be about 7½ volts and the voltage drop between the collector and emitter electrodes of transistor TR3 will be about one-half volt. The base-emitter voltage drop of transistor TR1 is about one-half volt, so the voltage at the emitter of transistor TR1 and across resistor R7 will be about 7 volts less the drop across resistor R3, which may be about 1 volt. This voltage is developed across resistor $7 and is applied to the emitter electrode of transistor TR2 reverse biasing the base-emitter junction of this transistor and turning it off. Transistor TR4 then will be turned off.

The voltage developed across resistor R1 and applied to the base electrode of transistor TR1 holds transistor TR1 on after switch S1 has opened. As lamp L1 becomes hot, the voltage drop across it increases stabilizing at about 5½ volts, the voltage drop across resistor R1 decreases to about 6 volts and the voltage drop across resistor R7 decreases to about 5½ volts, the same voltage as was across this resistor for stable state operation of stage 11. If switch S2 now is closed momentarily, stage 11 will turn on in the same way as stage 10 did previously, and stage 10 will turn off in the same way as stage 11 did previously.

It should be noted that turn off of a stage does not result from the positive regenerative effect, since transistor TR3, for example, when turned on, is in saturation, and the output current thereof does not vary during the first small change in base-emitter current. A change in base-emitter current sufficient to take transistor TR3 out of saturation is required as discussed hereinbefore.

If resistor R7 is chosen to limit the maximum current to a safe level, switch S1 may be practically a short circuit when closed. Alternatively, it may offer a high resistance, e.g., 10 megohms when resistor R3 also has a high resistance, e.g., 2.2 megohms, such that sufficient base current is caused to flow to turn on transistor TR1.

It will be seen from the foregoing that the positive temperature coefficients of resistance of lamps L1 and L2 are employed in the derivation of a voltage that cancels the "on" stage in response to selection of another stage.

It is to be understood that the voltages referred to hereinbefore are for explanatory purposes and will vary with the particular components selected and the power supply voltage.

It will be seen from the foregoing that when stage 10 is on, and stage 11 is off, lamp L1 will be illuminated giving a visual indication that stage 10 is on, while lamp L2 will be off. Similarly, when stage 11 is on, lamp L2 will be illuminated.

The latching network may be used solely as an indicator, or, alternatively, voltages developed in the various stages when they are turned on may be supplied directly to utilization devices or indirectly thereto via relays or the like.

It should be noted that either of stages 10 or 11 could be used individually to latch on a lamp such as L1. In this case resetting could be achieved by (a) opening the power supply circuit, (b) shorting the base-emitter of the first transistor of the stage, (c) momentarily opening the feedback circuit, and (d) applying a negative pulse to the base of the first transistor of the stage.

Those skilled in the art will appreciate that while the preferred embodiment of this invention has been disclosed herein, changes and modifications may be made therein without departing from the spirit and scope of this invention as defined in the appended claims.

What I claim as my invention is:

1. A latching network comprising at least first and second groups of transistors, each of said groups including first and second transistors each having input, output and common electrodes, in each of said groups, means interconnecting said first and second transistors of said group to turn on and off said second transistor of said group when said first transistor of said group is turned on and off respectively; in each of said groups, a device having a positive temperature coefficient of resistance and a first resistor connected in series circuit with each other and with said output and common electrodes of said second transistor of said group; in each of said groups, means for supplying a voltage developed across said first resistor to said input electrode of said first transistor of said group to hold said first transistor of said group on when said second transistor of said group is turned on; in each of said groups, means for turning on said first transistor of said group; and a resistor common to all of said groups and connected in circuit with said output and common electrodes of said first transistors of said groups and across which a voltage is developed in response to conduction of any one of said first transistors and applied to all others of said first transistors to turn off any other conductive one of said first transistors.

2. The invention according to claim 1 wherein said device is an incandescent lamp.

3. The invention according to claim 1 including a common power supply for each of said groups of said transistors, said power supply being connected to supply the same DC voltage to each of said groups.

4. The invention according to claim 3 wherein said device is an incandescent lamp.

5. The invention according to claim 4 wherein said means for supplying a voltage developed across said first resistor to said input electrode of said first transistor of said group comprises a second resistor connected between said first resistor and said input electrode of said first transistor of said group.